US012608057B2

(12) United States Patent
Tsorng et al.

(10) Patent No.: US 12,608,057 B2
(45) Date of Patent: Apr. 21, 2026

(54) EXTENDIBLE BAY FOR EXPANSION CARD

(71) Applicant: Quanta Computer Inc., Taoyuan (TW)

(72) Inventors: Yaw-Tzorng Tsorng, Taoyuan (TW);
Jen-Jia Liou, Taoyuan (TW); Wei-Jie Chen, Taoyuan (TW); Shao-Hsien Liu, Taoyuan (TW)

(73) Assignee: Quanta Computer Inc., Taoyuan City (TW)

( * ) Notice: Subject to any disclaimer, the term of this patent is extended or adjusted under 35 U.S.C. 154(b) by 199 days.

(21) Appl. No.: 18/540,600

(22) Filed: Dec. 14, 2023

(65) Prior Publication Data

US 2025/0123659 A1      Apr. 17, 2025

Related U.S. Application Data

(60) Provisional application No. 63/589,905, filed on Oct. 12, 2023.

(51) Int. Cl.
| | |
|---|---|
| *G06F 1/18* | (2026.01) |
| *G06F 1/183* | (2026.01) |
| *H05K 7/14* | (2006.01) |

(52) U.S. Cl.
CPC ........... *G06F 1/183* (2013.01); *H05K 7/1402* (2013.01); *H05K 7/1461* (2013.01)

(58) Field of Classification Search
CPC .......... G06F 1/183; G06F 1/185; G06F 1/186; H05K 7/1461; H05K 7/1402
See application file for complete search history.

(56) References Cited

U.S. PATENT DOCUMENTS

| | | | | | |
|---|---|---|---|---|---|
| 6,772,246 | B2 * | 8/2004 | Kim | .................. | G06F 1/185 |
| | | | | | 361/801 |
| 10,356,930 | B2 * | 7/2019 | Schulze | .............. | H05K 7/1425 |
| 2009/0073645 | A1 * | 3/2009 | Tsai | .................. | G06F 1/185 |
| | | | | | 361/679.6 |
| 2011/0128710 | A1 * | 6/2011 | Kuo | .................. | G06F 1/186 |
| | | | | | 361/759 |

(Continued)

FOREIGN PATENT DOCUMENTS

| | | |
|---|---|---|
| CN | 216848657 U | 6/2022 |
| TW | 201318538 A | 5/2013 |

OTHER PUBLICATIONS

TW Office Action for Application No. 113104694 mailed Aug. 28, 2024, w/ First Office Action Summary, 5 pp.

(Continued)

*Primary Examiner* — Farley Abad
(74) *Attorney, Agent, or Firm* — NIXON PEABODY LLP

(57) ABSTRACT

An extendible bay for an expansion card includes a base, an electrical connector, and an extender bracket. The base defines an interior space that is sized to receive at least a portion of the expansion card therein, and has an elongated shape with a first end and an opposing second end. The electrical connector is coupled to the base and is configured to electrically connect with a corresponding electrical connector of the expansion card. The extender bracket is slidably coupled to the first end of the base and is movable relative to the base such that the length of the extendible bay between the extender bracket and the second end of the base is adjustable to match a length of the expansion card.

20 Claims, 12 Drawing Sheets

(56) References Cited

U.S. PATENT DOCUMENTS

| | | | | |
|---|---|---|---|---|
| 2011/0249397 A1* | 10/2011 | Liu | ......................... | G06F 1/185 |
| | | | | 361/784 |
| 2013/0107441 A1* | 5/2013 | Zhou | ...................... | G06F 1/185 |
| | | | | 248/298.1 |
| 2014/0168910 A1* | 6/2014 | Yin | ......................... | G06F 1/186 |
| | | | | 361/747 |
| 2021/0357005 A1* | 11/2021 | Chang | ................... | C02F 1/5245 |
| 2022/0117111 A1* | 4/2022 | Tseng | ..................... | G06F 1/186 |

OTHER PUBLICATIONS

TW Search Report for Application No. 113104694 mailed Aug. 28, 2024, w/ First Office Action, 1 p.

* cited by examiner

EXTENDIBLE BAY FOR EXPANSION CARD

CROSS-REFERENCE TO RELATED APPLICATIONS

This application claims priority from and the benefit of U.S. Provisional Patent Application Ser. No. 63/589,905, filed on Oct. 12, 2023, titled "Design Of The Bay To Solve The Different Length PCIe Card Assembly," which is hereby incorporated by reference herein in its entirety.

FIELD OF THE INVENTION

The present disclosure relates generally to a bay for receiving an expansion card to be installed in a computing device, and more specifically, to an extendible bay that can accommodate expansion cards of different sizes.

BACKGROUND OF THE INVENTION

Expansion cards can be added to computing devices to provide additional functionality that the computing device may not otherwise possess. Generally, such a computing device will include a bay that can receive the expansion card to electrically connect the expansion card to a motherboard (and/or another board) of the computing device. Because of space constraints within a housing of the computing device, the expansion card is often connected to the motherboard using a riser board, such that the expansion card is disposed above and parallel to the motherboard. The bay can be designed so that it can aid in supporting the expansion card when the expansion card is installed. However, because compatible expansion cards are not required to all have the same length, certain bays are only able to fully support expansion cards with matching lengths. Expansion cards of different lengths, while still installable, will generally not be able to be supported. Thus, new systems and devices are needed for installing such expansion cards.

SUMMARY OF THE INVENTION

The term embodiment and like terms, e.g., implementation, configuration, aspect, example, and option, are intended to refer broadly to all the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementation, the present disclosure is directed to an extendible bay for an expansion card that includes a base, an electrical connector, and an extender bracket. The base defines an interior space that is sized to receive at least a portion of the expansion card therein, and has an elongated shape with a first end and an opposing second end. The electrical connector is coupled to the base and is configured to electrically connect with a corresponding electrical connector of the expansion card. The extender bracket is slidably coupled to the first end of the base and is movable relative to the base such that the length of the extendible bay between the extender bracket and the second end of the base is adjustable to match a length of the expansion card.

In some aspects of the first implementation, a length of the base is less than a length of the expansion card.

In some aspects of the first implementation, the base includes a floor, a first sidewall extending from the floor, and a second sidewall extending from the floor. The base is configured to receive the expansion card at least partially between the first sidewall and the second sidewall.

In some aspects of the first implementation, the extender bracket includes a first arm, a second arm, and one or more crossmembers extending between the first arm and the second. The first arm abuts and is parallel to the first sidewall of the base when the extendible bay is coupled to the base. The second arm abuts and is parallel to the second sidewall of the base when the extendible bay is coupled to the base.

In some aspects of the first implementation, the first sidewall of the base includes a first lip extending from a portion of an upper edge of the first sidewall opposite the floor. The first lip extends toward the second sidewall and the floor such that a first channel is defined between the first lip and a portion of the first sidewall. A portion of the first arm of the extender bracket is disposed within the first channel when the extender bracket is coupled to the base.

In some aspects of the first implementation, the second sidewall of the base includes a second lip extending from a portion of an upper edge of the second sidewall opposite the floor. The second lip extends toward the first sidewall and the floor such that a second channel is defined between the second lip and a portion of the second sidewall. A portion of the second arm of the extender bracket is disposed within the second channel when the extender bracket is coupled to the base.

In some aspects of the first implementation, the first sidewall of the base has a first slot defined therein, and the first arm of the extender bracket has a first mounting boss extending therefrom. The first mounting boss is disposed within the first slot of the first sidewall to slidably couple the first arm to the first sidewall.

In some aspects of the first implementation, the second sidewall of the base has a second slot defined therein and the second arm of the extender bracket has a second mounting boss extending therefrom. The second mounting boss is disposed within the second slot of the second sidewall to slidably couple the second arm to the second sidewall.

In some aspects of the first implementation, the extendible bay further includes a first locking feature and a second locking feature. The first locking feature is configured to be coupled to the first mounting boss such that a portion of the first sidewall is positioned between the first mounting boss and the first arm. The second locking feature is configured to be coupled to the second mounting boss such that a portion of the second sidewall is positioned between the second mounting boss and the second arm. The first locking feature and the second locking feature can each be tightened to prevent sliding movement of the extender bracket relative to the base, and can each be loosened to allow sliding movement of the extender bracket relative to the base.

In some aspects of the first implementation, the first mounting boss and the second mounting boss are each externally threaded, and the first locking feature and the second locking feature are each internally threaded.

In some aspects of the first implementation, the extender bracket further includes an attachment plate coupled to at least one of the one or more crossmembers, the attachment plate being configured to be coupled to the expansion card when the when the expansion card is received in the base.

In some aspects of the first implementation, the attachment plate includes at least one mounting aperture that is aligned with a corresponding aperture in the expansion card. The at least one mounting aperture and the corresponding aperture in the expansion card are sized to receive a fastener therein to couple the attachment plate to the expansion card.

In some aspects of the first implementation, the electrical connector is formed as part of a riser board that is mounted to a riser bracket. The riser bracket is coupled to the first sidewall, the second sidewall, or both, and a portion of the riser bracket is disposed at the second end of the base opposite the extender bracket.

In some aspects of the first implementation, when the expansion card is received in the base, the extender bracket is configured to be coupled to a first end of the expansion card and a portion of the riser bracket is configured to be coupled to an opposing second end of the expansion card.

In some aspects of the first implementation, the extender bracket is movable between a fully retracted position and a fully extended position. The length of the extendible bay between the extender bracket in the fully retracted position and the second end of the base is about 260 millimeters, and the length of the extendible bay between the extender bracket in the fully extended position and the second end of the base is about 320 millimeters.

In a second implementation, the present disclosure is directed to a computing device that includes a housing, a motherboard disposed in the housing, and an extendible bay disposed within the housing. The extendible bay includes a base, a riser bracket coupled to the base, a riser board mounted to the riser bracket, and an extender bracket coupled to the base. The base is sized to receive at least a portion of an expansion card therein, and has an elongated shape with a first end and an opposing second end. The riser board includes a first electrical connector connected to the motherboard, and a second electrical connector configured to electrically connect with a corresponding electrical connector of the expansion card when the expansion card is received in the base. The extender bracket is slidably coupled to the first end of the base, and is movable relative to the base such that the length of the extendible bay between the extender bracket and the second end of the base is adjustable to match a length of the expansion card.

In a third implementation, the present disclosure is directed to a method for installing an expansion card into an extendible bay of a computing device. The extendible bay includes a base defining an interior space sized to receive the expansion card, and an extender bracket slidably coupled to the base. The method includes sliding the extender bracket to a fully extended position. The method further includes electrically connecting the expansion card to an electrical connector of a riser board that is mounted to a riser bracket. The method further includes inserting the expansion card into the interior space of the base and coupling the riser bracket to the base. The method further includes sliding the extender bracket toward an end of the expansion card until the extender bracket abuts the end of the expansion card. The method further includes coupling at least one locking feature to the extender bracket to prevent movement of the extender bracket relative to the base. The method further includes coupling the extender bracket to the expansion card.

In some aspects of the third implementation, the base includes a first sidewall and a second sidewall, and the extender bracket includes a first arm abutting the first sidewall and a second arm abutting the second sidewall.

In some aspects of the third implementation, the first sidewall has a first channel defined therein and the second sidewall has a second channel defined therein. The first arm includes a first mounting boss slidably received within the first channel and the second arm includes a second mounting boss slidably received within the second channel.

In some aspects of the third implementation, coupling the at least one locking feature to the extender bracket includes coupling a first locking feature to the first mounting boss such that the first sidewall is squeezed between the first locking feature and the first arm of the extender bracket to prevent movement of the first arm of the extender bracket relative to the first sidewall, and coupling a second locking feature to the second mounting boss such that the second sidewall is squeezed between the second locking feature and the second arm of the extender bracket to prevent movement of the second arm of the extender bracket relative to the second sidewall.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Figure 1:
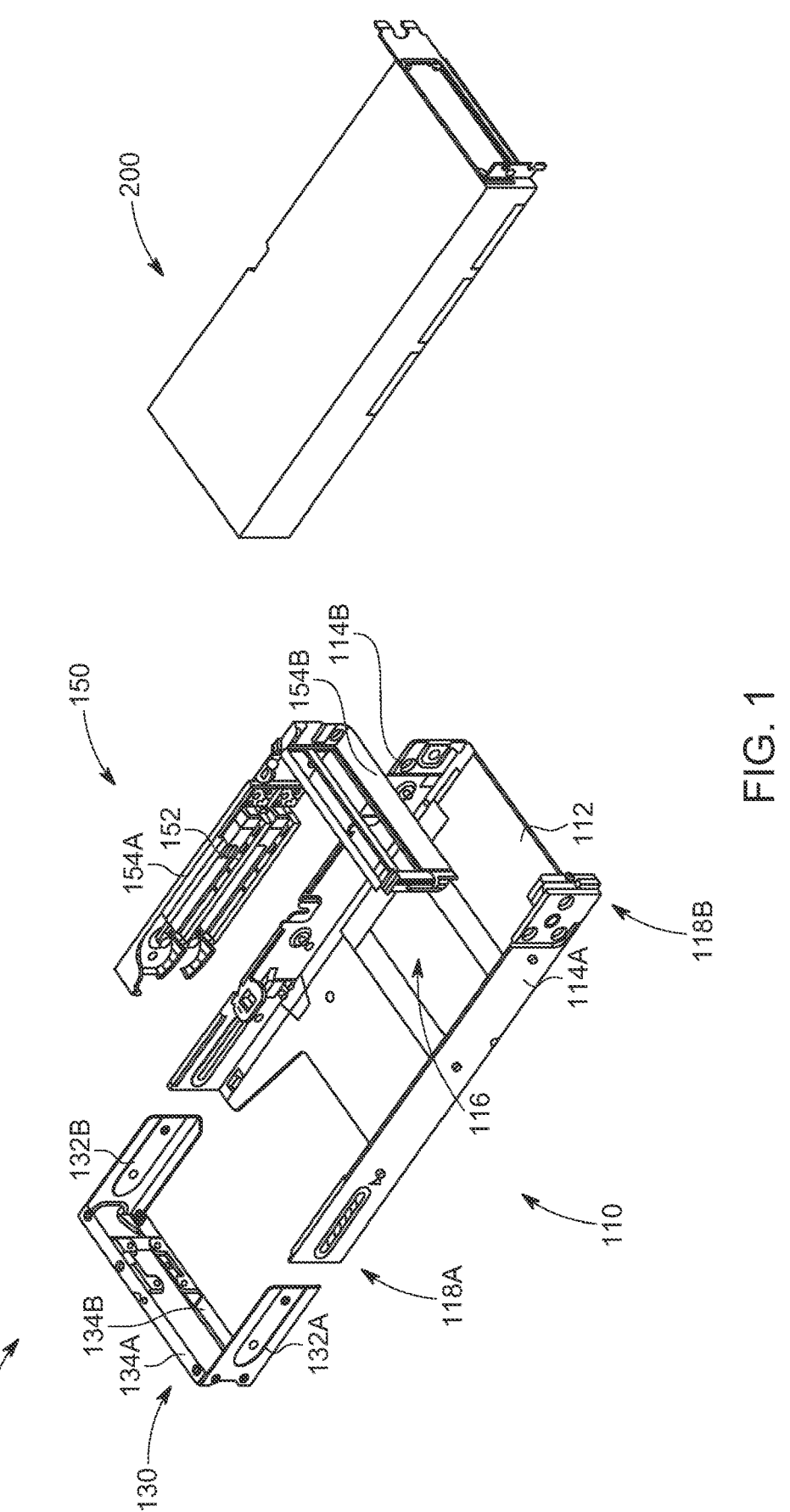
FIG. 1 is an exploded view of an extendible bay for receiving an expansion card, according to aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1 shows an exploded view of an extendible bay 100 and an expansion card 200 that can be received within the extendible bay 100. The bay 100 can be located within the housing of a larger computing device or system. The expansion card 200 can be placed into the bay 100 to electrically connected the expansion card 200 to a motherboard of the computing device. The expansion card 200 can generally be any suitable type of expansion card that can be connected to a computing device, such as a PCIe card, a mini PCIe card, a PCI-X card, a M.2 card, or any other suitable expansion card. As discussed herein, the length of the bay 100 can be adjusted in order to fit expansion cards 200 of different length, while still retaining the ability to support the expansion card 200 and prevent it from drooping down toward the motherboard.

The bay 100 includes a base 110 and an extender bracket 130. In the illustrated implementation, the bay 100 also includes a riser bracket 150 and a riser board 152 mounted to the riser bracket 150. The riser board 152 has a first electrical connector that can be electrically connected to the motherboard of the computing device, and a second electrical connector that can be electrically connected to the expansion card 200. This allows the expansion card 200 to be received in the bay 100 so that the expansion card 200 is positioned above and parallel to the motherboard. In other implementations however, the bay 100 may not include the riser bracket 150 and/or the riser board 152.

The base 110 includes a floor 112, a first sidewall 114A extending upward from one side of the floor 112, and a second sidewall 114B extending upward from the opposite edge of the floor 112. The floor 112, the first sidewall 114A, and the second sidewall 114B define an interior space 116 of the base 110 (and of the bay 100 as a whole) in which the expansion card 200 is received. In the illustrated implementation, the first sidewall 114A and the second sidewall 114B are generally parallel to each other, although they may have different orientations in other implementations. The base 110 is configured to receive the expansion card 200 at least partially between the first sidewall 114A and the second sidewall 114B.

The base 110 has an elongated shape that matches the general shape of the expansion card 200. The extender bracket 130 is coupled to the base 110 at a first end 118A of the base 110. The riser bracket 150 includes a first portion 154A to which the riser board 152 is mounted, and a second portion 154B extending generally perpendicular to the first portion 154A. The first portion 154A is coupled to either the first sidewall 114A or the second sidewall 114B such that the second portion 154B is located generally at the opposing second end 118B of the base 110. In some implementations, the expansion card 200 can rest upon and/or be coupled to the second portion 154B of the riser bracket 150 when the expansion card 200 is received in the base 110, to aid in supporting the expansion card 200.

The extender bracket 130 includes a first arm 132A, a second arm 132B, and crossmembers 134A and 134B extending between the first arm 132A and the second arm 132B. The first arm 132A is slidably coupled to the first sidewall 114A and the second arm 132B is slidably coupled to the second sidewall 114B to thereby slidably couple the extender bracket 130 to the base 110.

Figure 2A:
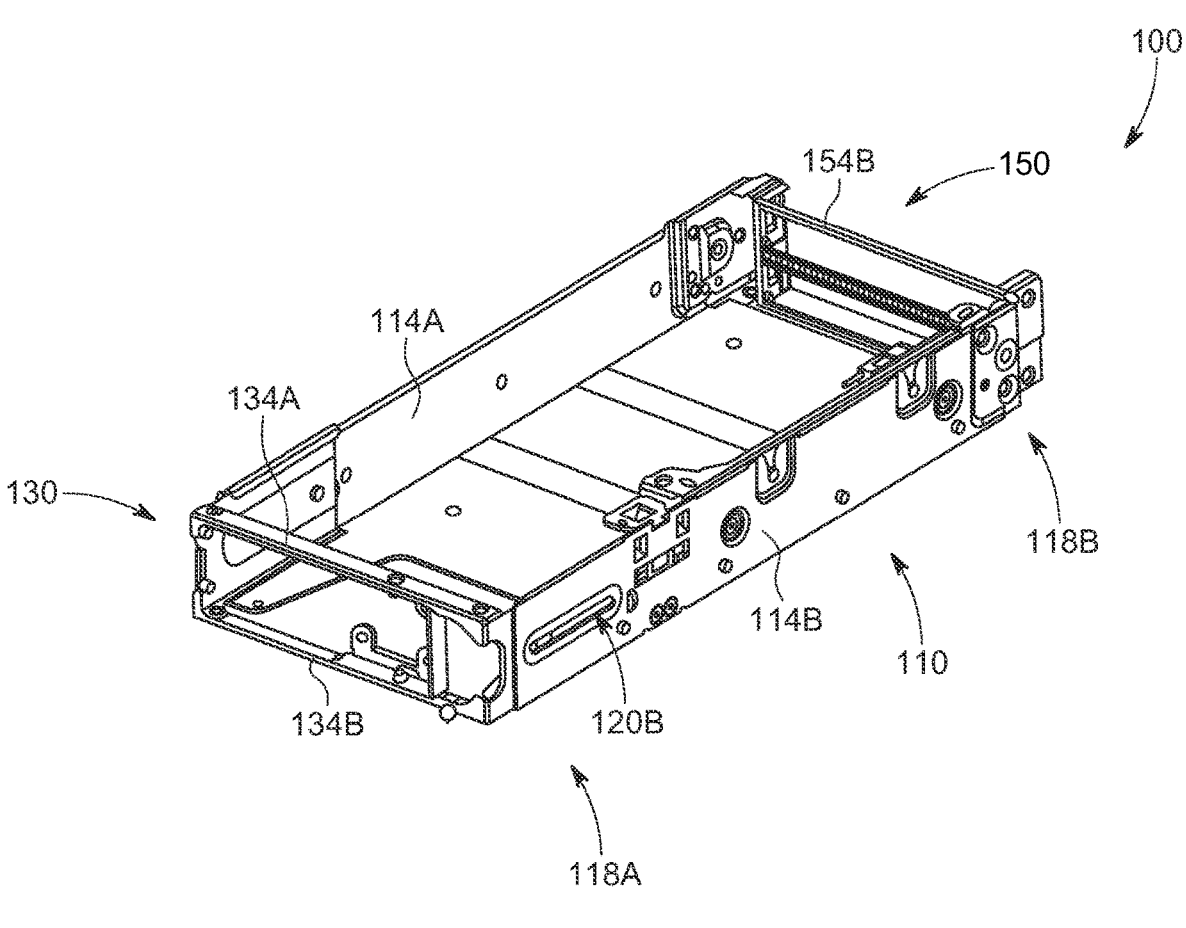
FIG. 2A is a perspective view of the extendible bay of FIG. 1 with an extender bracket in a fully retracted position, according to aspects of the present disclosure.
Figure 2B:
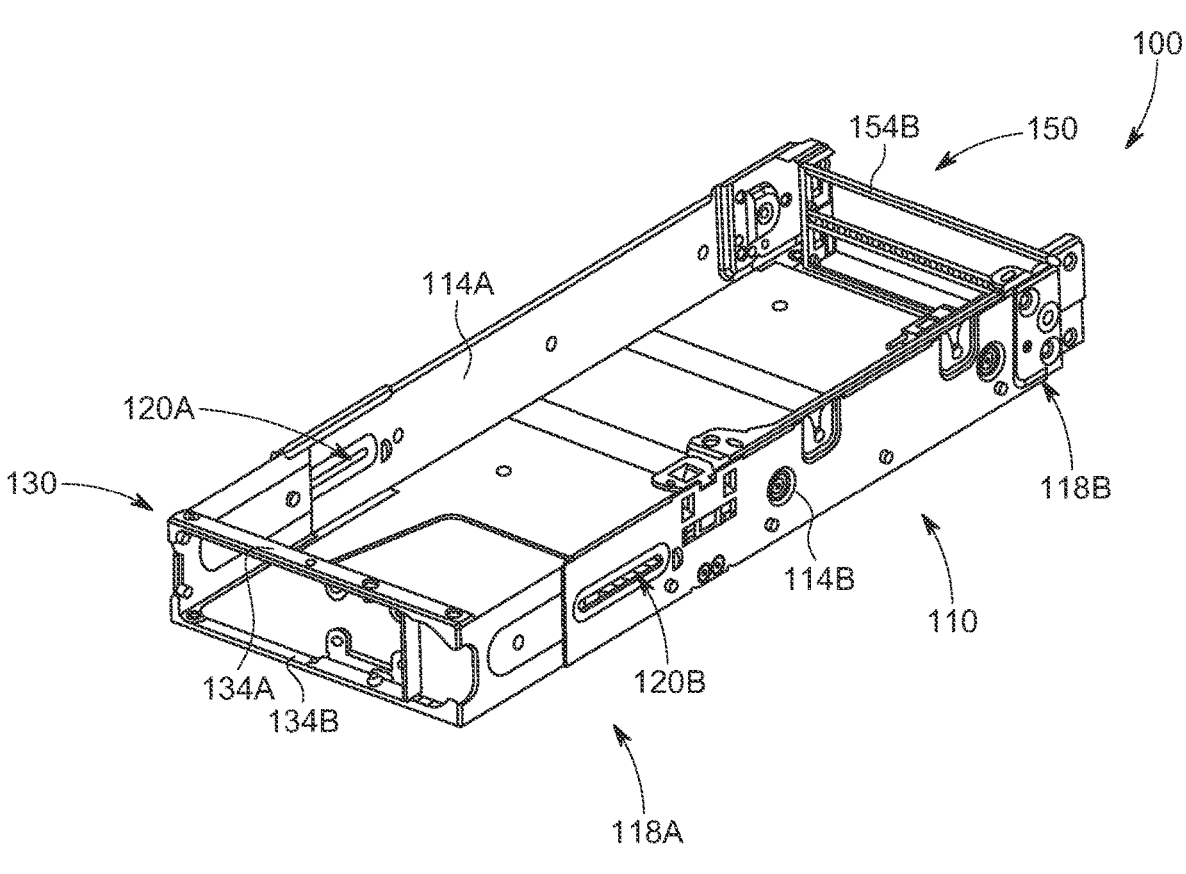
FIG. 2B is a perspective view of the extendible bay of FIG. 1 with an extender bracket in a fully retracted position, according to aspects of the present disclosure.

FIGS. 2A and 2B illustrate the bay 100 with the extender bracket 130 coupled to the base 110 in different positions. As shown, the first arm 132A abuts and is parallel to the first sidewall 114A, and the second arm 132B abuts and is parallel to the second sidewall 114B. In FIG. 2A, the extender bracket 130 is moved to a fully retracted position. In this position, the extender bracket 130 has been pushed as far as possible toward the second end 118B of the base 110 such that the crossmembers 134A and 134B are located at or near the ends of the first sidewall 114A and the second sidewall 114B at the first end 118A of the base 110. In FIG. 2B, the extender bracket 130 is moved to a fully extended position. In this position, the extender bracket 130 has been pulled as far as possible away from the second end 118B so that the crossmembers 134A and 134B are spaced apart from the ends of the first sidewall 114A and the second sidewall 114B at the first end 118A of the base 110.

Thus, the position of the extender bracket 130 can be adjusted depending on the length of the expansion card 200. The length of the bay 100 can generally be defined as the distance between the extender bracket 130 (e.g., the crossmembers 134A and 134B of the extender bracket 130) and the second end 118B of the base 110. In implementations where the second portion 154B of the riser bracket 150 is located at or near the second end 118B of the base 110, the length of the bay 100 can be defined as the distance between the extender bracket 130 (e.g., the crossmembers 134A and 134B of the extender bracket 130) and the second portion 154B of the riser bracket 150. The length of the base 110 itself will either be generally equal to the length of the expansion card 200, or will be less than the length of the expansion card 200. The extender bracket 130 can then be moved to the desired position so that the overall length of the bay 100 is generally equal to the length of the expansion card 200. Thus, the length of the bay 100 is adjustable to match the length of the expansion card 200.

FIGS. 2A and 2B also show the riser bracket 150 coupled to the base 110. In the illustrated implementation, the first portion 154A is coupled to the second sidewall 114B, but in other implementations, could be coupled to the first sidewall 114A, or coupled to both the first sidewall 114A and the second sidewall 114B. The second portion 154B is positioned at the second end 118B of the base 110, generally perpendicular to the first portion 154A. When the expansion card 200 is placed into the bay 100, the edge of the expansion card 200 adjacent to the second end 118B of the base 110 can rest on the second portion 154B of the riser bracket 150 to help support the expansion card 200. In some implementations, the distal end of the second portion 154B is coupled to first sidewall 114A, which increases the strength of the riser bracket 150 in supporting the expansion card 200. In some implementations, the end of the expansion card 200 only rests on the second portion 154B. In other implementations however, the expansion card 200 can be coupled to the second portion 154B, such as via clips, screws, pins, etc.

FIGS. 2A and 2B further illustrate a first slot 120A and a second slot 120B that are defined in the first sidewall 114A and the second sidewall 114B, respectively. As discussed further herein, portions of the first arm 132A and the second arm 132B can be disposed within the slots 120A and 120B, respectively, when the extender bracket 130 is coupled to the base 110. The slots 120A and 120B define the movement that the extender bracket 130 is able to undergo when coupled to the base 110, and define the fully retracted and fully extended positions of the extender bracket 130.

Figure 3:
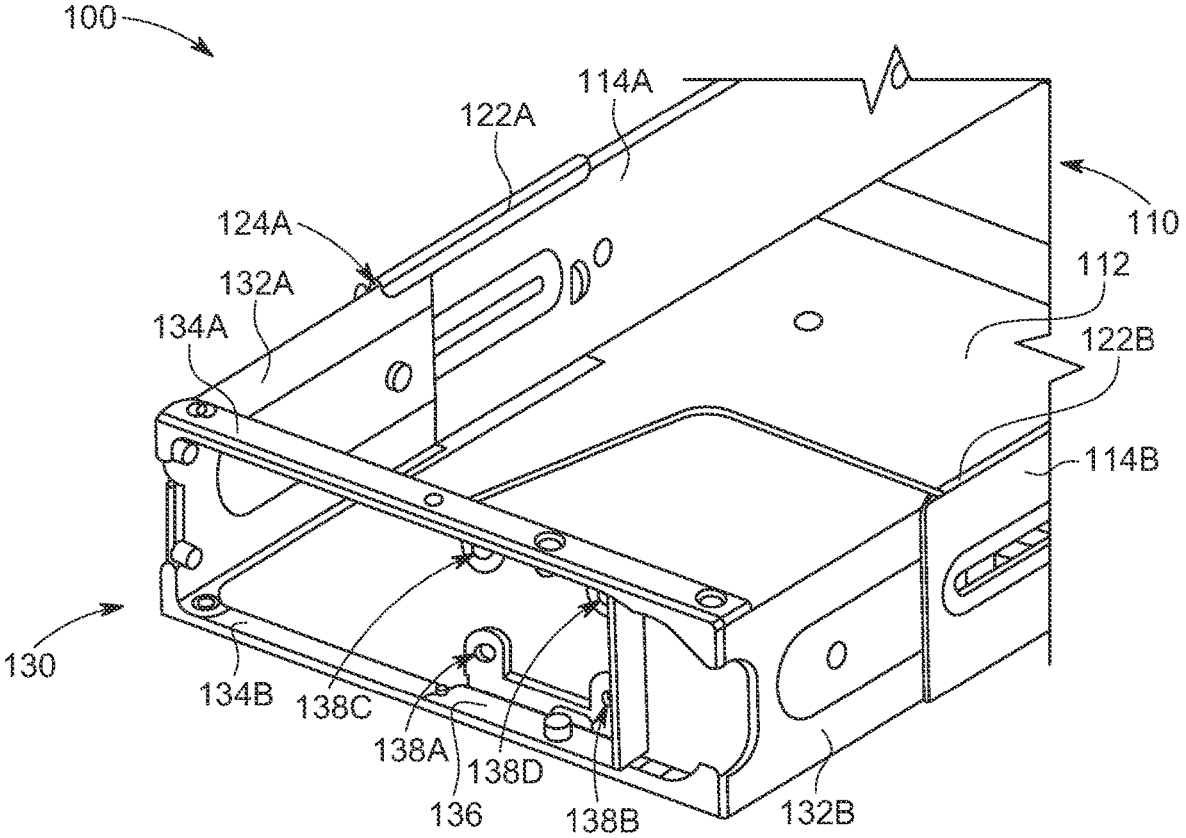
FIG. 3 is a zoomed-in view of the extender bracket of the extendible bay of FIG. 1, according to aspects of the present disclosure.

FIG. 3 is a zoomed-in view of the bay 100 that illustrates how the extender bracket 130 is coupled to the base 110. As shown, the first sidewall 114A includes a lip 122A that extends from the upper edge of the first sidewall 114A (e.g., the edge of the first sidewall 114A opposite from the floor 112). The lip 122A extends generally outward toward the second sidewall 114B and downward toward the floor 112, such that a channel 124A is defined between the lip 122A and a portion of the first sidewall 114A. When the extender bracket 130 is coupled to the base 110, the upper edge of the first arm 132A slides into the channel 124A. The lip 122A thus aids in maintaining the first arm 132A in position abutting the first sidewall 114A. At least a portion of the upper edge of the first arm 132A is disposed within the channel 124A for all positions of the extender bracket 130 when coupled to the base 110.

The second sidewall 114B includes a lip 122B extending from the upper edge thereof. The lip 122B is generally identical to the lip 122A, and extends outward toward the first sidewall 114A and downward toward the floor 112. While not visible in FIG. 3, the upper edge of the second arm 132B slides into a channel defined between the lip 122B and the second sidewall 114B, similar to the channel 124A. Like the lip 122A, the lip 122B aids in maintaining the second arm 132B in position abutting the second sidewall 114B. At least a portion of the upper edge of the second arm 132B is disposed within the channel for all positions of the extender bracket 130 when coupled to the base 110.

FIG. 3 also shows an attachment plate 136 that can be coupled to the crossmembers 134A and 134B in some implementations. When the expansion card 200 is placed into the bay 100 and the extender bracket 130 is adjusted to match the length of the expansion card 200, the attachment plate 136 can be coupled to the end of the expansion card 200 to help support the expansion card 200. In the illustrated implementation, the attachment plate 136 also includes mounting apertures 138A, 138B, 138C, and 138D, which will be aligned with corresponding mounting apertures in the expansion card 200. The mounting apertures 138A-138D and the corresponding mounting apertures in the expansion card 200 are all sized to receive fasteners that can be used to couple the expansion card 200 to the attachment plate 136. In some implementations, the mounting apertures 138A-138D and the mounting apertures and the expansion card 200 are threaded so that screws can be used to couple the expansion card 200 to the attachment plate 136.

Figure 4A:
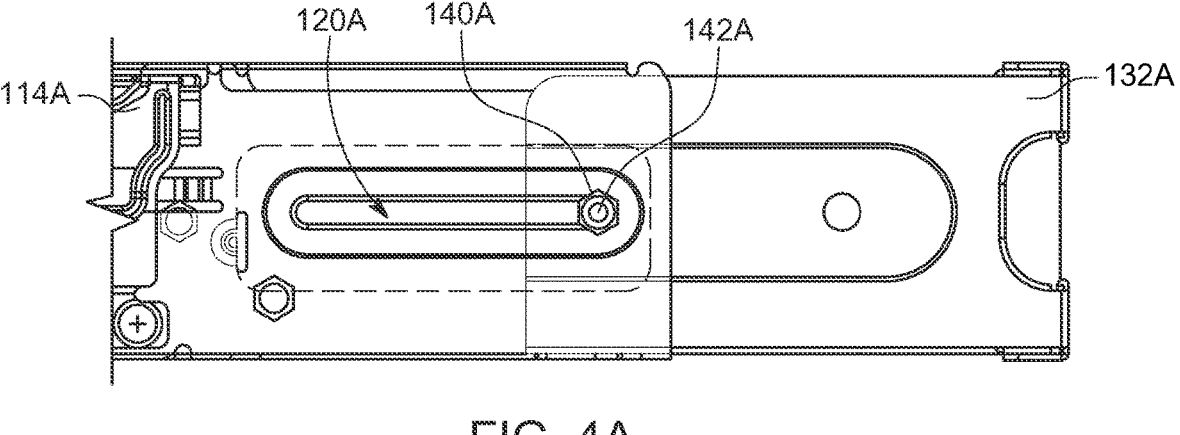
FIG. 4A is a zoomed-in view of the coupling between a first sidewall of the extendible bay and a first arm of the extender bracket, according to aspects of the present disclosure.
Figure 4B:
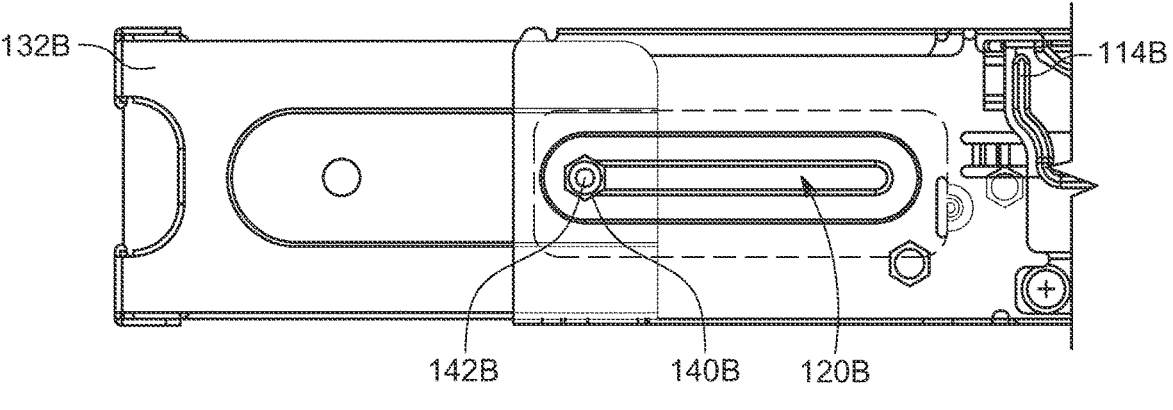
FIG. 4B is a zoomed-in view of the coupling between a second sidewall of the extendible bay and a second arm of the extender bracket, according to aspects of the present disclosure.

FIG. 4A illustrates the first sidewall 114A and the first arm 132A when the extender bracket 130 is coupled to the base 110, and FIG. 4B illustrates the second sidewall 114B and the first arm 132A when the extender bracket 130 is coupled to the base 110. The first arm 132A includes a first mounting boss 140A that extends from the first arm 132A toward the first sidewall 114A and is disposed within the first slot 120A. The second arm 132B includes a second mounting boss 140B that is similar to the first mounting boss 140A, which extends from the second arm 132B and is disposed in the second slot 120B. As the extender bracket 130 moves relative to the base 110, the first mounting boss 140A moves within the first slot 120A, and the second mounting boss 140B moves within the second slot 120B. When one or both of the first mounting boss 140A and the second mounting boss 140B reaches either end of their respective slot 120A, 120B, the extender bracket 130 cannot move any further in that direction. The slots 120A and 120B thus defines the distance and direction in which the extender bracket 130 can move.

The ends of the slots 120A and 120B define the fully extended and fully retracted positions of the extender bracket 130. In FIG. 4A, the first mounting boss 140A is located at the distal end of the first slot 120A, and in FIG. 4B, the second mounting boss 140B is located at the distal end of the second slot 120B, which places the extender bracket 130 into the fully extended position. To move the extender bracket 130 to the fully retracted position, the extender bracket 130 can be moved toward the opposite end of the base 110 until the first mounting boss 140A is located at the proximal end of the first slot 120A (e.g., the left end of the first slot 120A relative to the plane of FIG. 4A) and the second mounting boss 140B is located at the proximal end of the second slot 120B (e.g., the right end of the second slot 120B relative to the plane of FIG. 4B).

The bay 100 can further include one or more locking features that can lock the extender bracket 130 in place relative to the base 110. In the illustrated implementation, the one or more locking features include a first locking feature 142A that is coupled to the first mounting boss 140A and a second locking feature 142B that is coupled to the second mounting boss 140B. The first locking feature 142A is coupled to a distal end of the first mounting boss 140A, such that a portion of the first sidewall 114A around the first slot 120A is positioned between the first arm 132A and the first locking feature 142A. Similarly, the second locking feature 142B is coupled to a distal end of the second mounting boss 140B, such that a portion of the second sidewall 114B around the second slot 120B is positioned between the second arm 132B and the second locking feature 142B.

The first locking feature 142A can be tightened onto the first mounting boss 140A such that the first sidewall 114A is squeezed between the first arm 132A and the first mounting boss 140A, which prevents sliding movement of the first arm 132A relative to the first sidewall 114A. Similarly, the second locking feature 142B can be tightened onto the second mounting boss 140B such that the second sidewall 114B is squeezed between the second arm 132B and the second mounting boss 140B, which prevents sliding movement of the second arm 132B relative to the second sidewall 114B. Together, the first and second locking features 142A and 142B can be tightened in order to prevent sliding movement of the extender bracket 130 as a whole relative to the base 110. The first and second locking features 142A and 142B can then be loosened to allow the extender bracket 130 to move relative to the base 110. In some implementations, the first and second mounting bosses 140A and 140B are externally threaded, and the first and second locking features 142A and 142B are internally threaded. In these implementations, the first and second locking features 142A and 142B can be screwed onto the first and second mounting bosses 140A and 140B, respectively, in order to lock the extender bracket 130 relative to the base 110.

In the illustrated implementation, the first mounting boss 140A and the second mounting boss 140B are generally shown as being integrally formed with the first arm 132A and the second arm 132B, respectively. In other implementations however, separate components may be used to lock the extender bracket 130 in place. For example, instead of integral mounting bosses, the first arm 132A and the second arm 132B may include mounting apertures that are aligned with the first slot 120A and the second slot 120B, respectively. A separate component (e.g., a screw, a bolt, a pin, a clip, etc.) can be inserted through the first slot and the mounting aperture of the first arm 132A, and through the second slot and the mounting aperture of the second arm 132B. Locking features (which may be the same as or similar to the locking features 142A and 142B) can then be tightened onto these components in order to lock the extender bracket 130 in place.

Figure 5A:
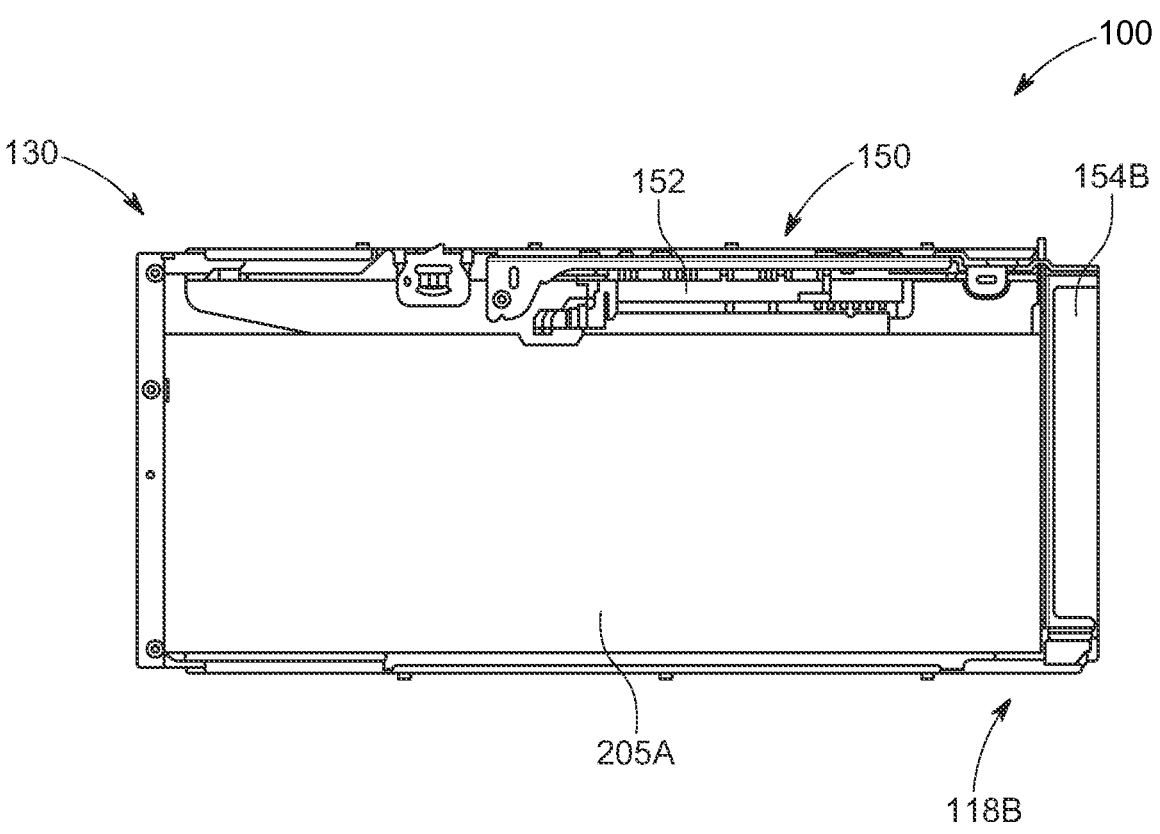
FIG. 5A is a top view of a short expansion card installed in the extendible bay of FIG. 1, according to aspects of the present disclosure.
Figure 5B:
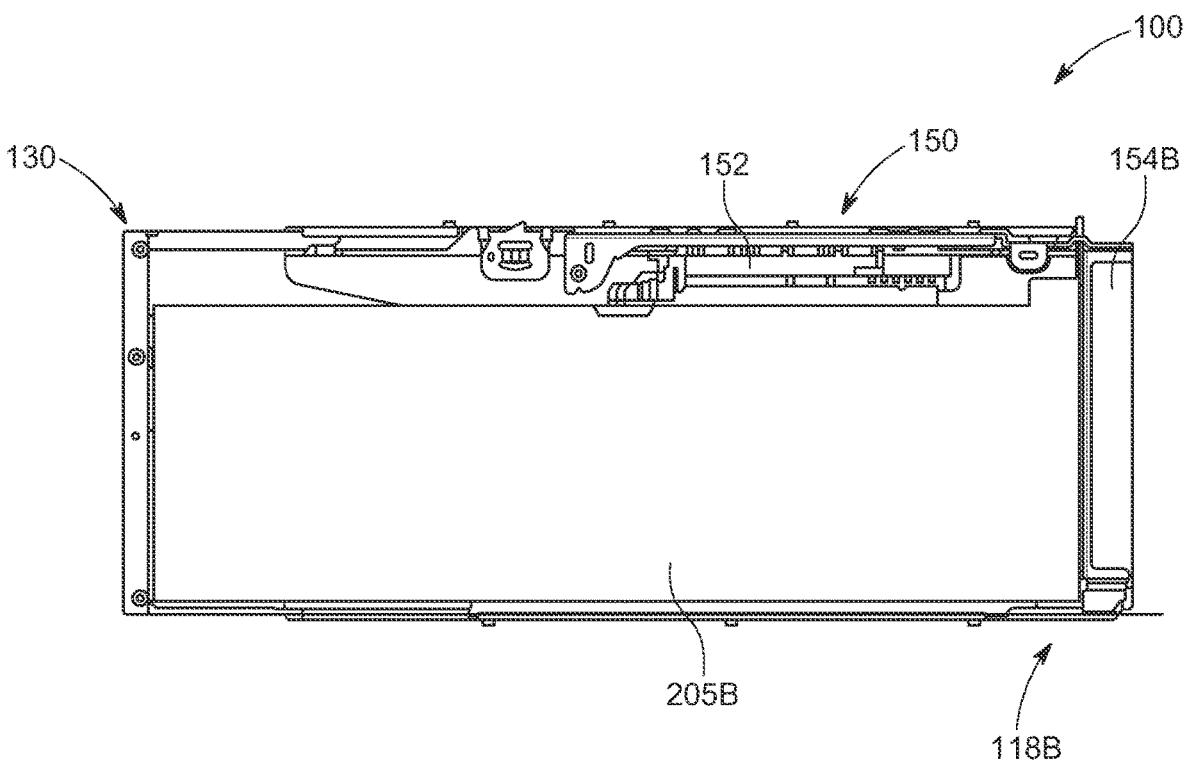
FIG. 5B is a top view of a long expansion card installed in the extendible bay of FIG. 1, according to aspects of the present disclosure.

FIGS. 5A and 5B illustrate how the length of the extendible bay 100 can be adjusted to accommodate expansion cards of different lengths. In FIG. 5A, an expansion card 205A having a relatively shorter length has been placed into the extendible bay 100 such the expansion card 205A is electrically connected to the riser board 152 and one end of the expansion card 205A abuts the second portion 154B of the riser bracket 150. The extender bracket 130 has been moved to the fully retracted position such that it abuts the opposite end of the expansion card 205A. The extender bracket 130 can then be coupled to the end of the expansion card 205A to help support the expansion card 205A. Thus, with the extender bracket 130 in the fully retracted position, the length of the bay 100 from the extender bracket 130 to the second end 118B of the base 110 generally matches the length of the shorter expansion card 205A.

In FIG. 5B, an expansion card 205B having a relatively longer length has been placed into the extendible bay 100 such the expansion card 205B is electrically connected to the riser board 152 and one end of the expansion card 205B abuts the second portion 154B of the riser bracket 150. The extender bracket 130 has been moved to the fully extended position to accommodate the longer length of the expansion card 205B. The extender bracket 130 can then be coupled to the end of the expansion card 205B to help support the expansion card 205B. Thus, with the extender bracket 130 in the fully extended position, the length of the bay 100 from the extender bracket 130 to the second end 118B of the base 110 generally matches the length of the longer expansion card 205B. In some implementations, the length of the bay 100 when the extender bracket 130 is in the fully retracted position is about 260 millimeters, and the length of the bay 100 when the extender bracket 130 is in the fully extended position is about 320 millimeters.

While FIGS. 5A and 5B only show the bay 100 when the extender bracket 130 in the fully retracted and fully extended positions, the extender bracket 130 can be in any position between fully retracted and fully extended to accommodate the length of a desired expansion card, so long as the extender bracket 130 can be coupled to the end of the expansion card to help support the expansion card.

Figure 6A:
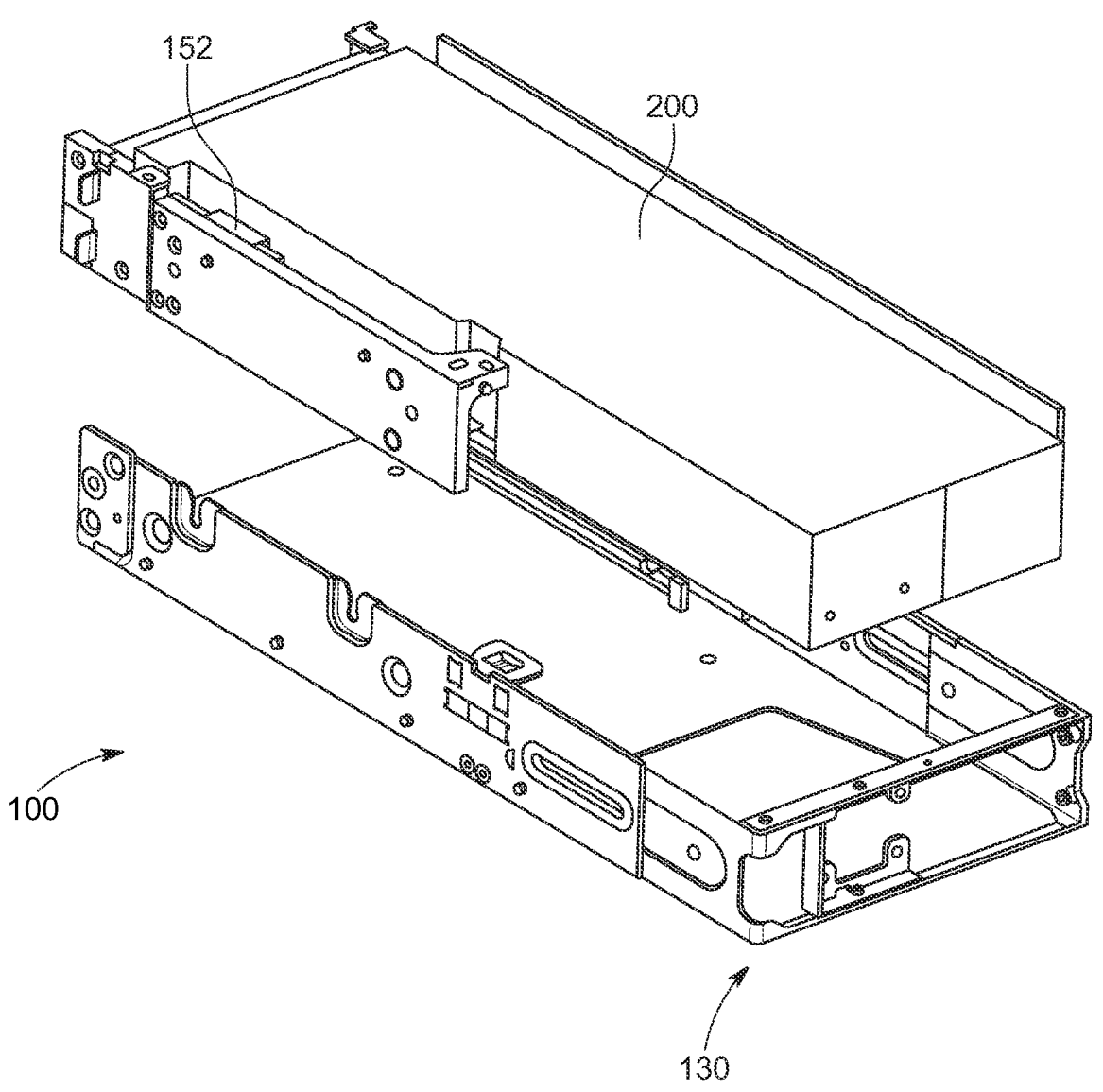
FIG. 6A is a perspective view of a first step of installing an expansion card in the extendible bay of FIG. 1, according to aspects of the present disclosure.
Figure 6B:
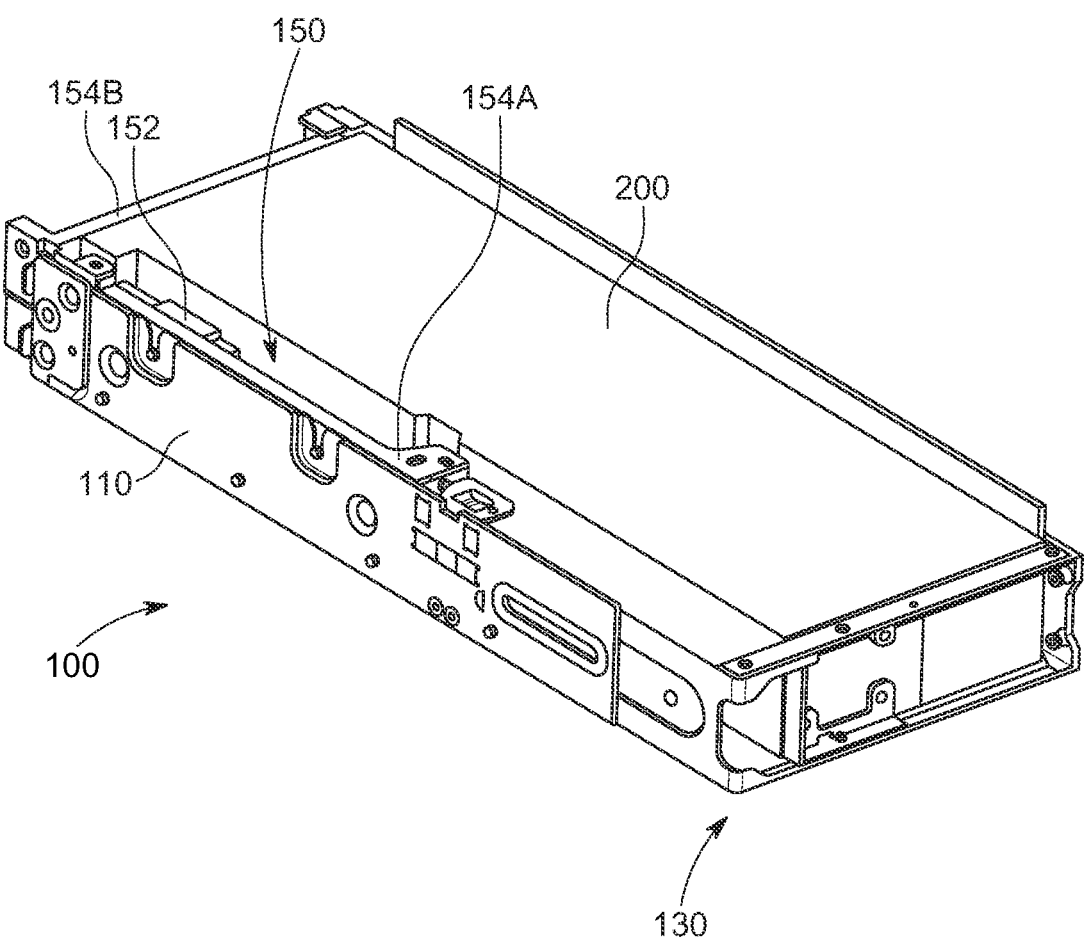
FIG. 6B is a perspective view of a second step of installing the expansion card in the extendible bay of FIG. 1, according to aspects of the present disclosure.
Figure 6C:
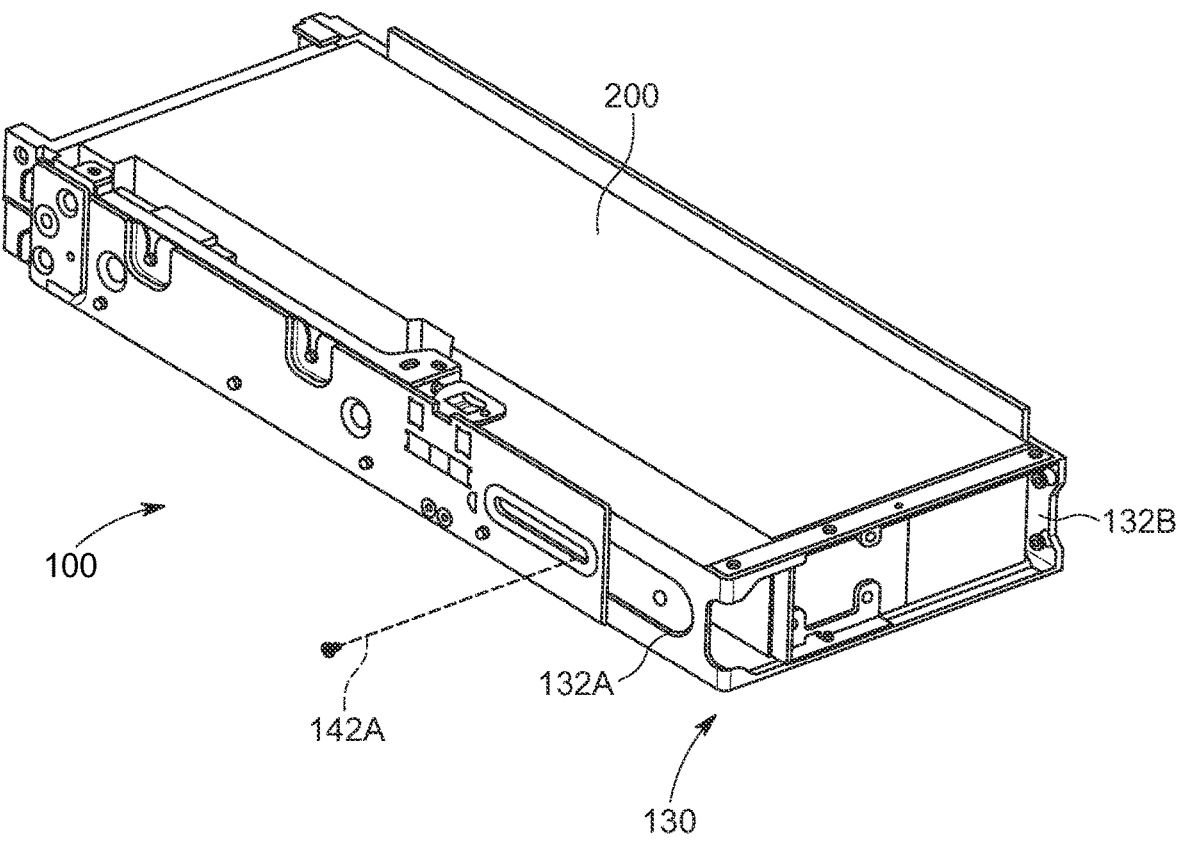
FIG. 6C is a perspective view of a third step of installing the expansion card in the extendible bay of FIG. 1, according to aspects of the present disclosure.
Figure 6D:
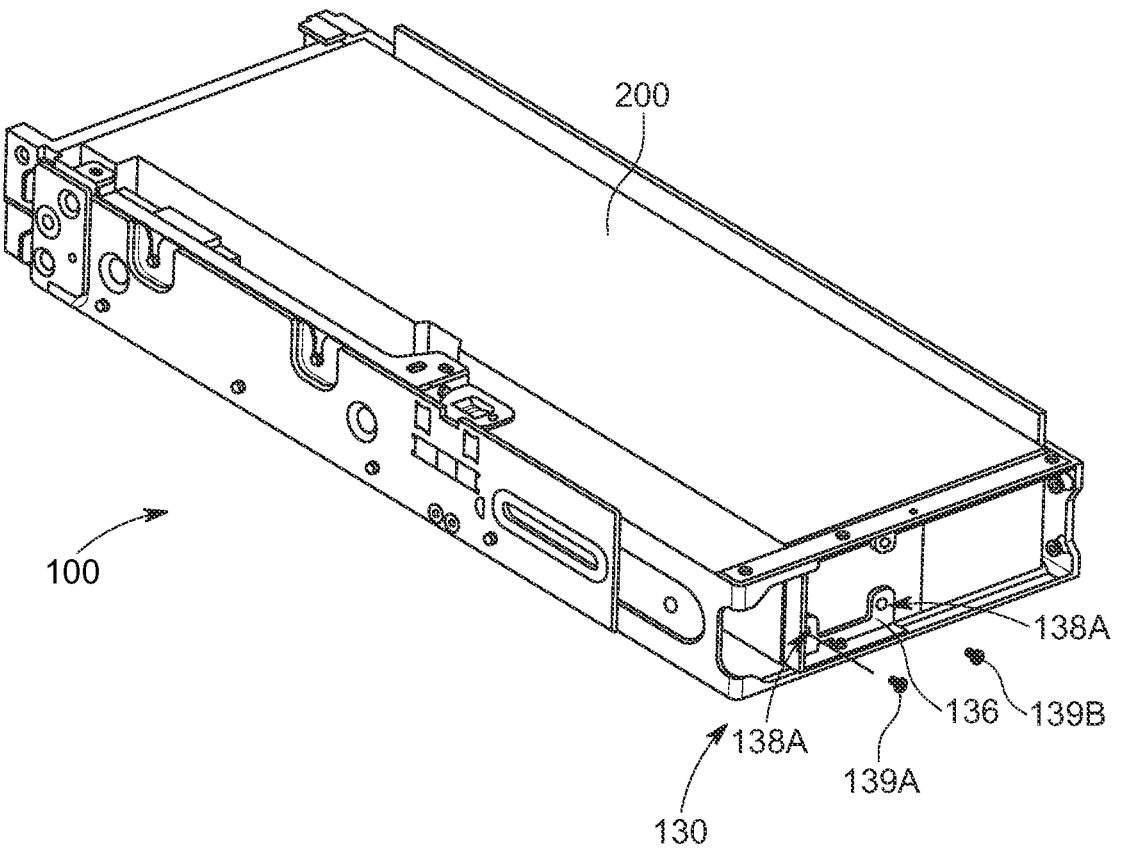
FIG. 6D is a perspective view of a fourth step of installing the expansion card in the extendible bay of FIG. 1, according to aspects of the present disclosure.

FIGS. 6A-6D illustrate how the expansion card 200 is installed into the extendible bay 100 to accommodate an expansion card 200. In FIG. 6A, the extender bracket 130 has been moved to the fully extended position, and the expansion card 200 has been electrically connected to the riser board 152. In FIG. 6B, the expansion card 200 has been inserted into the interior space of the base 110, and extender bracket 130 has also been moved away from the fully extended position and toward the expansion card 200 so that the extender bracket 130 contacts the expansion card 200. The riser bracket 150 has also been coupled to the base 110, which will generally include coupling both the first portion 154A and the second portion 154B to the base 110. If the bay 100 is located within the housing of a larger computing device during the installation of the expansion card 200, the riser board 152 may electrically connected to the motherboard of the computing device when the expansion card 200 is inserted into the bay 100. FIG. 6C shows the first and second locking features 142A and 142B being coupled to the first arm 132A and the second arm 132B (e.g., to the respective mounting bosses 140A and 140B of the arms 132A and 132B), so that the extender bracket 130 is locked into position. FIG. 6D shows the attachment plate 136 of the extender bracket 130 being coupled to the expansion card 200 using fasteners that are inserted through the mounting apertures in the attachment plate 136 and coupled to a portion of the expansion card 200. In the illustrated implementation, fasteners 139A and 139B are inserted through mounting apertures 138A and 138B. However, any number of fasteners can be used to couple the attachment plate 136 to the expansion card 200. As discussed herein, the fasteners 139A and 139B can be screws that are screwed into the attachment plate 136 and into the expansion card 200.

Figure 7:
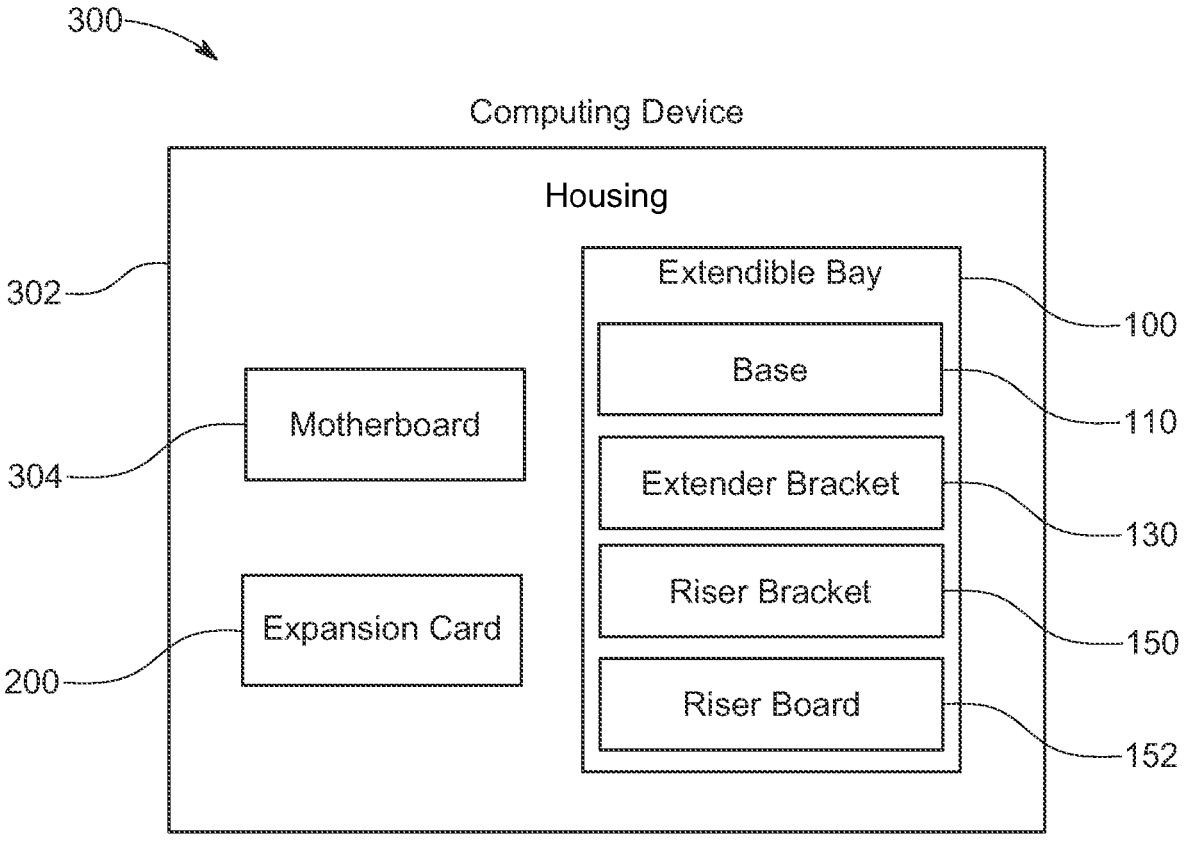
FIG. 7 is a block diagram of an example computing device that includes the extendible bay of FIG. 1, according to aspects of the present disclosure.

FIG. 7 shows a block diagram of an example computing device 300. The computing device 300 includes a housing 302, a motherboard 304 positioned within the housing 302, and the extendible bay 100 positioned at least partially within the housing 302. The extendible bay 100 includes the base 110, the extender bracket 130, the riser bracket 150, and the riser board 152. The expansion card 200 may also be positioned at least partially within the housing 302 when received in the base 110. The riser bracket 150 is coupled to the base 110, and the riser board 152 is mounted to the riser bracket 150 and includes electrical connectors to electrically connect to the motherboard 304 and the expansion card 200. The extender bracket 130 is movable relative to the base 110 so that the length of the extendible bay 100 is adjustable to match the length of the expansion card 200.

Although the disclosed embodiments have illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described been above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. An extendible bay for an expansion card, the extendible bay comprising:

a base defining an interior space that is sized to receive at least a portion of the expansion card therein, the base having an elongated shape with a first end and an opposing second end;

an electrical connector coupled to the base and configured to electrically connect with a corresponding electrical connector of the expansion card; and an extender bracket slidably coupled to the first end of the base, the extender bracket being movable relative to the base such that the length of the extendible bay between the extender bracket and the second end of the base is adjustable to match a length of the expansion card;

wherein the base includes a floor, a first sidewall extending from the floor, and a second sidewall extending from the floor, the base being configured to receive the expansion card at least partially between the first sidewall and the second sidewall; and wherein the extender bracket includes a first arm, a second arm, and one or more crossmembers extending between the first arm and the second, the first arm abutting and being parallel to the first sidewall of the base when the extendible bay is coupled to the base, the second arm abutting and being parallel to the second sidewall of the base when the extendible bay is coupled to the base.

2. The extendible bay of claim 1, wherein a length of the base is less than a length of the expansion card.

3. The extendible bay of claim 1, wherein the first sidewall of the base includes a first lip extending from a portion of an upper edge of the first sidewall opposite the floor, the first lip extending toward the second sidewall and the floor such that a first channel is defined between the first lip and a portion of the first sidewall, and wherein a portion of the first arm of the extender bracket is disposed within the first channel when the extender bracket is coupled to the base.

4. The extendible bay of claim 1, wherein the second sidewall of the base includes a second lip extending from a portion of an upper edge of the second sidewall opposite the floor, the second lip extending toward the first sidewall and the floor such that a second channel is defined between the second lip and a portion of the second sidewall, and wherein a portion of the second arm of the extender bracket is disposed within the second channel when the extender bracket is coupled to the base.

5. The extendible bay of claim 1, wherein the first sidewall of the base has a first slot defined therein and wherein the first arm of the extender bracket has a first mounting boss extending therefrom, the first mounting boss being disposed within the first slot of the first sidewall to slidably couple the first arm to the first sidewall.

6. The extendible bay of claim 5, wherein the second sidewall of the base has a second slot defined therein and wherein the second arm of the extender bracket has a second mounting boss extending therefrom, the second mounting boss being disposed within the second slot of the second sidewall to slidably couple the second arm to the second sidewall.

7. The extendible bay of claim 6, further comprising:

a first locking feature configured to be coupled to the first mounting boss such that a portion of the first sidewall is positioned between the first mounting boss and the first arm; and a second locking feature configured to be coupled to the second mounting boss such that a portion of the second sidewall is positioned between the second mounting boss and the second arm, wherein the first locking feature and the second locking feature can each be tightened to prevent sliding movement of the extender bracket relative to the base, and can each be loosened to allow sliding movement of the extender bracket relative to the base.

8. The extendible bay of claim 7, wherein the first mounting boss and the second mounting boss are each externally threaded, and wherein the first locking feature and the second locking feature are each internally threaded.

9. The extendible bay of claim 1, wherein the extender bracket further includes an attachment plate coupled to at least one of the one or more crossmembers, the attachment plate being configured to be coupled to the expansion card when the when the expansion card is received in the base.

10. The extendible bay of claim 9, wherein the attachment plate includes at least one mounting aperture that is aligned with a corresponding aperture in the expansion card, the at least one mounting aperture and the corresponding aperture in the expansion card being sized to receive a fastener therein to couple the attachment plate to the expansion card.

11. The extendible bay of claim 1, wherein the electrical connector is formed as part of a riser board that is mounted to a riser bracket, the riser bracket being coupled to the first sidewall, the second sidewall, or both, a portion of the riser bracket being disposed at the second end of the base opposite the extender bracket.

12. The extendible bay of claim 11, wherein when the expansion card is received in the base, the extender bracket is configured to be coupled to a first end of the expansion card and a portion of the riser bracket is configured to be coupled to an opposing second end of the expansion card.

13

14

13. The extendible bay of claim 1, wherein the extender bracket is movable between a fully retracted position and a fully extended position, the length of the extendible bay between the extender bracket in the fully retracted position and the second end of the base being about 260 millimeters, the length of the extendible bay between the extender bracket in the fully extended position and the second end of the base being about 320 millimeters.

14. A computing device comprising:

a housing;

a motherboard disposed in the housing; and an extendible bay disposed within the housing, the extendible bay comprising:

a base that is sized to receive at least a portion of an expansion card therein, the base having an elongated shape with a first end and an opposing second end;

a riser bracket coupled to the base;

a riser board mounted to the riser bracket, the riser board including a first electrical connector connected to the motherboard, and a second electrical connector configured to electrically connect with a corresponding electrical connector of the expansion card when the expansion card is received in the base; and an extender bracket slidably coupled to the first end of the base, the extender bracket being movable relative to the base such that the length of the extendible bay between the extender bracket and the second end of the base is adjustable to match a length of the expansion card;

wherein the base includes a floor, a first sidewall extending from the floor, and a second sidewall extending from the floor, the base being configured to receive the expansion card at least partially between the first sidewall and the second sidewall; and wherein the extender bracket includes a first arm, a second arm, and one or more crossmembers extending between the first arm and the second, the first arm abutting and being parallel to the first sidewall of the base when the extendible bay is coupled to the base, the second arm abutting and being parallel to the second sidewall of the base when the extendible bay is coupled to the base.

15. A method for installing an expansion card into an extendible bay of a computing device, the extendible bay including a base defining an interior space sized to receive the expansion card, and an extender bracket slidably coupled to the base, the method comprising:

sliding the extender bracket to a fully extended position;

electrically connecting the expansion card to an electrical connector of a riser board, the riser board being mounted to a riser bracket;

inserting the expansion card into the interior space of the base and coupling the riser bracket to the base;

sliding the extender bracket toward an end of the expansion card until the extender bracket abuts the end of the expansion card;

coupling at least one locking feature to the extender bracket to prevent movement of the extender bracket relative to the base; and coupling the extender bracket to the expansion card;

wherein the base includes a first sidewall and a second sidewall, and wherein the extender bracket includes a first arm abutting the first sidewall and a second arm abutting the second sidewall.

16. The method of claim 15, wherein the first sidewall has a first channel defined therein and the second sidewall has a second channel defined therein, and wherein the first arm includes a first mounting boss slidably received within the first channel and the second arm includes a second mounting boss slidably received within the second channel.

17. The method of claim 16, wherein coupling the at least one locking feature to the extender bracket includes:

coupling a first locking feature to the first mounting boss such that the first sidewall is squeezed between the first locking feature and the first arm of the extender bracket to prevent movement of the first arm of the extender bracket relative to the first sidewall; and coupling a second locking feature to the second mounting boss such that the second sidewall is squeezed between the second locking feature and the second arm of the extender bracket to prevent movement of the second arm of the extender bracket relative to the second sidewall.

18. An extendible bay for an expansion card, the extendible bay comprising:

a base defining an interior space that is sized to receive at least a portion of the expansion card therein, the base having an elongated shape with a first end and an opposing second end;

an electrical connector coupled to the base and configured to electrically connect with a corresponding electrical connector of the expansion card; and an extender bracket slidably coupled to the first end of the base, the extender bracket being movable relative to the base such that the length of the extendible bay between the extender bracket and the second end of the base is adjustable to match a length of the expansion card;

wherein the base includes a floor, a first sidewall extending from the floor, and a second sidewall extending from the floor, the base being configured to receive the expansion card at least partially between the first sidewall and the second sidewall; and wherein the electrical connector is formed as part of a riser board that is mounted to a riser bracket, the riser bracket being coupled to the first sidewall, the second sidewall, or both, a portion of the riser bracket being disposed at the second end of the base opposite the extender bracket.

19. The extendible bay of claim 18, wherein when the expansion card is received in the base, the extender bracket is configured to be coupled to a first end of the expansion card and a portion of the riser bracket is configured to be coupled to an opposing second end of the expansion card.

20. An extendible bay for an expansion card, the extendible bay comprising:

a base defining an interior space that is sized to receive at least a portion of the expansion card therein, the base having an elongated shape with a first end and an opposing second end;

an electrical connector coupled to the base and configured to electrically connect with a corresponding electrical connector of the expansion card; and an extender bracket slidably coupled to the first end of the base, the extender bracket being movable relative to the base such that the length of the extendible bay between the extender bracket and the second end of the base is adjustable to match a length of the expansion card;

wherein the extender bracket is movable between a fully retracted position and a fully extended position, the length of the extendible bay between the extender bracket in the fully retracted position and the second end of the base being about 260 millimeters, the length of the extendible bay between the extender bracket in the fully extended position and the second end of the base being about 320 millimeters.

* * * * *